(12) United States Patent
Tsuda et al.

(10) Patent No.: US 11,114,302 B2
(45) Date of Patent: Sep. 7, 2021

(54) SUBSTRATE PROCESSING APPARATUS AND SUBSTRATE PROCESSING METHOD

(71) Applicant: SCREEN Holdings Co., Ltd., Kyoto (JP)

(72) Inventors: Shotaro Tsuda, Kyoto (JP); Nobuyasu Hiraoka, Kyoto (JP); Nobuaki Okita, Kyoto (JP); Takayuki Nishida, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/476,567

(22) PCT Filed: Nov. 22, 2017

(86) PCT No.: PCT/JP2017/042009
§ 371 (c)(1),
(2) Date: Jul. 9, 2019

(87) PCT Pub. No.: WO2018/146906
PCT Pub. Date: Aug. 16, 2018

(65) Prior Publication Data
US 2019/0333771 A1    Oct. 31, 2019

(30) Foreign Application Priority Data
Feb. 10, 2017 (JP) .............. JP2017-023151

(51) Int. Cl.
| B08B 3/02 | (2006.01) |
| H01L 21/304 | (2006.01) |
| H01L 21/02 | (2006.01) |
| H01L 21/306 | (2006.01) |
| H01L 21/67 | (2006.01) |

(52) U.S. Cl.
CPC .............. *H01L 21/304* (2013.01); *B08B 3/02* (2013.01); *H01L 21/02096* (2013.01); *H01L 21/306* (2013.01); *H01L 21/67046* (2013.01); *H01L 21/67051* (2013.01)

(58) Field of Classification Search
CPC ... B08B 3/02; H01L 21/304; H01L 21/02096; H01L 21/306; H01L 21/67046; H01L 21/67051
(Continued)

(56) References Cited

U.S. PATENT DOCUMENTS

2008/0289652 A1   11/2008  Hamada .......................... 134/6

FOREIGN PATENT DOCUMENTS

| JP | H11-168078 A | 6/1999 |
| JP | 2006-147673 A | 6/2006 |

(Continued)

OTHER PUBLICATIONS

JPH11168078A—Machine translation (Year: 1999).*
(Continued)

*Primary Examiner* — Tinsae B Ayalew
(74) *Attorney, Agent, or Firm* — Ostrolenk Faber LLP

(57) ABSTRACT

A substrate processing apparatus includes an upper cup part including a first tubular portion and a second tubular portion that are formed each in a tubular shape capable of surrounding a substrate held by a substrate holder, the second tubular portion being connected to an upper side of the first tubular portion. The substrate processing apparatus also includes a cup moving unit that moves the upper cup part in a vertical direction with respect to the substrate holder to stop the upper cup part at each of a position where the first tubular portion surrounds the substrate, and a position where the second tubular portion surrounds the substrate.

10 Claims, 8 Drawing Sheets

(58) Field of Classification Search
USPC .......................................................... 134/94.1
See application file for complete search history.

(56) References Cited

FOREIGN PATENT DOCUMENTS

| JP | 4018232 | B | 12/2007 |
|----|---------|---|---------|
| JP | 2009-231628 | A | 10/2009 |
| TW | 200618094 | A | 6/2006 |
| TW | 201528412 | A | 7/2015 |
| WO | WO 2017/018481 | A1 | 2/2017 |

OTHER PUBLICATIONS

JP2006147673A—Machine translation (Year: 2006).*
Notification Concerning Transmittal of International Preliminary Report on Patentability (Chapter I of the Patent Cooperation Treaty) dated Aug. 22, 2019, International Preliminary Report on Patentability, and Written Opinion of the International Searching Authority in corresponding International Application No. PCT/JP2017/042009 (with English translation sent by the International Bureau of WIPO).
International Search Report dated Feb. 13, 2018 in corresponding PCT International Application No. PCT/JP2017/042009.
Written Opinion dated Feb. 13, 2018 in corresponding PCT International Application No. PCT/JP2017/042009.
Office Action dated Jul. 30, 2018 in corresponding Taiwanese Patent Application No. 106141166, along with a partial English translation based on a Japanese translation.
Notice of Reasons for Refusal dated Sep. 29, 2020 in corresponding Japanese Patent Application No. 2017-023151 with English translation obtained from JPO.
Notification of Reason for Refusal dated Oct. 7, 2020 in corresponding Korean Patent Application No. 10-2019-7021972 with English translation obtained from the JPO.

* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2017/042009, filed Nov. 22, 2017, which claims priority to Japanese Patent Application No. 2017-023151, filed Feb. 10, 2017, the contents of which are incorporated herein by reference. The PCT International Application was published in the Japanese language.

TECHNICAL FIELD

The present invention relates to a substrate processing technique.

BACKGROUND ART

In wafer processing, scrubber processing may be performed to remove dust, attached substances, deposits, and the like on a wafer surface. In the scrubber processing, brushing is performed to bring a brush into contact with a rotating wafer at an appropriate pressure and move the brush while a predetermined processing solution is supplied to a substrate. After that, a drying process is performed to shake off a liquid on the substrate by rotating the substrate at a high speed while the brush is retracted. As an apparatus that performs the scrubber processing as described above, Patent Document 1 discloses an apparatus, for example.

PRIOR ART DOCUMENT

Patent Document

Patent Document 1: Japanese Patent Application Laid-Open No. 2009-231628

SUMMARY

Problem to be Solved by the Invention

Patent Document 1 discloses a substrate processing apparatus that is configured to allow a liquid shaken off from a substrate in brushing and a drying process to be received by an inner peripheral surface of an identical upper cup. This enables reduction in space saving of the apparatus, cost reduction, and simplification of control as compared with when a dedicated upper cup is prepared for each process.

However, the substrate processing apparatus of Patent Document 1 may cause a liquid containing foreign matter generated during the brushing to adhere to the upper cup. Then, when the liquid shaken off during the drying process collides with the upper cup, the foreign matter may reattach to the substrate.

Thus, an object of the present invention is to provide a technique of reduction in that foreign matter adhering to a cup reattaches to a substrate.

Means to Solve the Problem

To solve the above-mentioned problem, a first aspect is a substrate processing apparatus for treating a substrate, the substrate processing apparatus including: a substrate holder that holds a substrate in a horizontal posture, and rotates around a rotation axis parallel to a vertical direction; a rotary drive unit that rotates the substrate holder; a cup part having a first tubular portion and a second tubular portion, being formed each in a tubular shape capable of surrounding the substrate held by the substrate holder, the first tubular portion being connected on one side in the vertical direction to the second tubular portion; a processing unit that supplies a treatment liquid to the substrate held by the substrate holder to treat the substrate; and a relative movement mechanism that relatively moves the cup part in the vertical direction with respect to the substrate holder to stop the cup part at each of a first relative position where the first tubular portion surrounds the substrate held by the substrate holder and a second relative position where the second tubular portion surrounds the substrate held by the substrate holder.

A second aspect is the substrate processing apparatus according to the first aspect, wherein the second tubular portion is connected to an upper side of the first tubular portion.

A third aspect is the substrate processing apparatus according to the second aspect, wherein the first tubular portion has a portion with an inner width smaller than that of the second tubular portion.

A fourth aspect is the substrate processing apparatus according to the second or third aspect, wherein an inner width of the cup part gradually decreases from the second tubular portion to the first tubular portion.

A fifth aspect is the substrate processing apparatus according to the third or fourth aspect, further including: an annular part that is provided in an vertically intermediate portion of the cup part while projecting inward of the cup part from an inner peripheral surface of the first tubular portion, and that has an inner edge portion provided with a hole allowing the substrate holder to pass through the hole in the vertical direction; and a connecting part connecting the first tubular portion and the annular part while forming a gap between the first tubular portion and the annular part.

A sixth aspect is the substrate processing apparatus according to any one of the second to fifth aspects, wherein the inner peripheral surface of the first tubular portion is a hydrophilic surface having more hydrophilicity than an inner peripheral surface of the second tubular portion.

A seventh aspect is the substrate processing apparatus according to any one of the first to sixth aspects, wherein the relative movement mechanism moves the cup part in the vertical direction.

An eighth aspect is the substrate processing apparatus according to any one of the first to seventh aspects, wherein the rotary drive unit rotates the substrate holder at a higher speed when the cup part is positioned at the second relative position than when the cup part is positioned at the first relative position.

A ninth aspect is the substrate processing apparatus according to the eighth aspect, wherein the processing unit includes the relative movement mechanism, the rotary drive unit, and a control unit that controls the processing unit, and the control unit performs first treatment of supplying the treatment liquid to the substrate rotating while causing the cup part to stop at the first relative position, and second treatment of removing the liquid on a surface of the substrate by rotating the substrate while causing the cup part to stop at the second relative position.

A tenth aspect is the substrate processing apparatus according to the ninth aspect, wherein the first treatment includes a process of forming a film of the treatment liquid throughout an upper surface of the substrate.

An eleventh aspect is the substrate processing apparatus according to the ninth or tenth aspect, wherein the processing unit further includes a brush unit that is brought into contact with the surface of the substrate and a brush moving mechanism that moves the brush unit between a contact position allowing the brush unit to be brought into contact with the substrate and a retreat position separated from the substrate, and the control unit also controls the brush moving mechanism, the first treatment including brushing of treating the substrate while bringing the brush unit into contact with the substrate rotating.

A twelfth aspect is the substrate processing apparatus according to any one of the first to eleventh aspects, wherein the cup part further includes a third tubular portion that is connected to one side of the second tubular portion in the vertical direction while being formed to be able to surround the substrate, and the relative movement mechanism relatively moves the cup part in the vertical direction with respect to the substrate holder to stop the cup part at a third relative position where the third tubular portion surrounds the substrate held by the substrate holder.

A thirteenth aspect is a substrate processing method for treating a substrate, including: (a) a holding step of holding a substrate in a horizontal posture; (b) a first surrounding step of surrounding the substrate with a first tubular portion in a tubular shape in a cup part; (c) a first treatment step of supplying a treatment liquid to a surface of the substrate while rotating the substrate surrounded by the first tubular portion; (d) a second surrounding step of surrounding the substrate with a second tubular portion in a tubular shape connected to one side of the first tubular portion in a vertical direction in the cup part after the first treatment step; and (e) a second treatment step of rotating the substrate surrounded by the second tubular portion.

A fourteenth aspect is the substrate processing method according to the thirteenth aspect, wherein the second tubular portion is connected to an upper side of the first tubular portion.

Effects of the Invention

According to the substrate processing apparatus of the first aspect, the first treatment can be performed while the substrate is surrounded by the first tubular portion of the cup part, and the second treatment can be performed while the substrate is surrounded by the second tubular portion of the cup part. Thus, even when foreign matter adheres to the first tubular portion by a liquid containing the foreign matter on the substrate being shaken off to the first tubular portion during the first treatment, reattachment of the foreign matter to the substrate during the second treatment can be reduced.

According to the substrate processing apparatus of the second aspect, performing the first treatment while the substrate is surrounded by the first tubular portion enables foreign matter generated during the first treatment to adhere to the first tubular portion below the second tubular portion. This causes the first tubular portion to which the foreign matter adheres to be disposed below the substrate when the second treatment is performed while the substrate is surrounded by the second tubular portion, so that reattachment of the foreign matter to the substrate can be effectively reduced.

According to the substrate processing apparatus of the third aspect, a liquid shaken off outward from the substrate in the second treatment can be received by the second tubular portion to flow down along an inner peripheral surface of a portion in the first tubular portion, having an inner width smaller than that of the second tubular portion. This enables foreign material adhering to the portion in the first tubular portion to be washed off.

According to the substrate processing apparatus of the fourth aspect, a liquid shaken off from the substrate in the second treatment can be received by the second tubular portion to flow down along an inner peripheral surface of a portion gradually decreasing in inner width from the second tubular portion to the first tubular portion. This enables washing off foreign matter adhering to a connection portion of the first tubular portion to the second tubular portion and a portion below the connection portion.

According to the substrate processing apparatus of the fifth aspect, the annular part can receive a liquid flowing toward the second tubular portion above the first tubular portion of liquids shaken off from the substrate during the first treatment. This enables preventing a liquid containing foreign matter from adhering to the second tubular portion above the first tubular portion. Thus, during the second treatment, adhesion of foreign matter generated during the first treatment to the substrate can be effectively reduced. In addition, during the second treatment, a liquid scattered from the substrate to the second tubular portion can flow down along the inner peripheral surface of the first tubular portion while passing through a gap between the annular part and the first tubular portion. This enables foreign material adhering to the first tubular portion to be washed off.

According to the substrate processing apparatus of the sixth aspect, the inner peripheral surface of the first tubular portion is a hydrophilic surface, so that a rebound of a liquid colliding with the inner peripheral surface of the first tubular portion can be reduced during the first treatment. This enables reattachment of foreign matter during the first treatment to be effectively reduced.

According to the substrate processing apparatus of the seventh aspect, moving the cup part enables simplifying an apparatus configuration as compared with when the substrate holder is moved in the vertical direction.

According to the substrate processing apparatus of the eighth aspect, while a liquid on the substrate is shaken off outward at high speed during the second treatment due to the number of rotations of the substrate, being more than that during the first treatment, a liquid existing on a surface of the substrate is received by the second tubular portion different from the first tubular portion to which foreign matter adheres. Thus, reattachment of the foreign matter adhering to the first tubular portion to the substrate can be effectively reduced.

According to the substrate processing apparatus of the ninth aspect, the first treatment using a treatment liquid and the second treatment for removing a liquid on the substrate can be performed.

According to the substrate processing apparatus of the tenth aspect, forming a film of the treatment liquid throughout an upper surface of the substrate during the first treatment enables the upper surface of the substrate to be treated uniformly.

According to the substrate processing apparatus of the eleventh aspect, when a liquid containing foreign matter generated by the brushing during the first treatment is received by the first tubular portion, the foreign matter may adhere to the inner peripheral surface of the first tubular portion. However, the second treatment allows the second tubular portion different from the first tubular portion to which the foreign matter adheres to receive the treatment liquid shaken off outward of the substrate, so that reattachment of the foreign matter generated during the first treatment to the substrate during the second treatment can be effectively reduced.

According to the substrate processing apparatus of the twelfth aspect, each of three portions different in vertically position in the cup part can receive a liquid shaken off from the substrate.

According to the substrate processing method of the thirteenth aspect, even when a liquid containing foreign matter generated during the first treatment adheres to the first tubular portion, the second treatment allows the substrate to be surrounded by the second tubular portion to enable reduction in reattachment of the foreign matter adhering to the first tubular portion to the substrate.

According to the substrate processing method of the fourteenth aspect, when foreign matter is generated during the first treatment, the foreign matter may adhere to the first tubular portion below the second tubular portion. Thus, the first tubular portion to which the foreign matter adheres is disposed below the substrate during the second treatment, so that reattachment of the foreign matter to the substrate can be effectively reduced.

DESCRIPTION OF EMBODIMENTS

Figure 1:
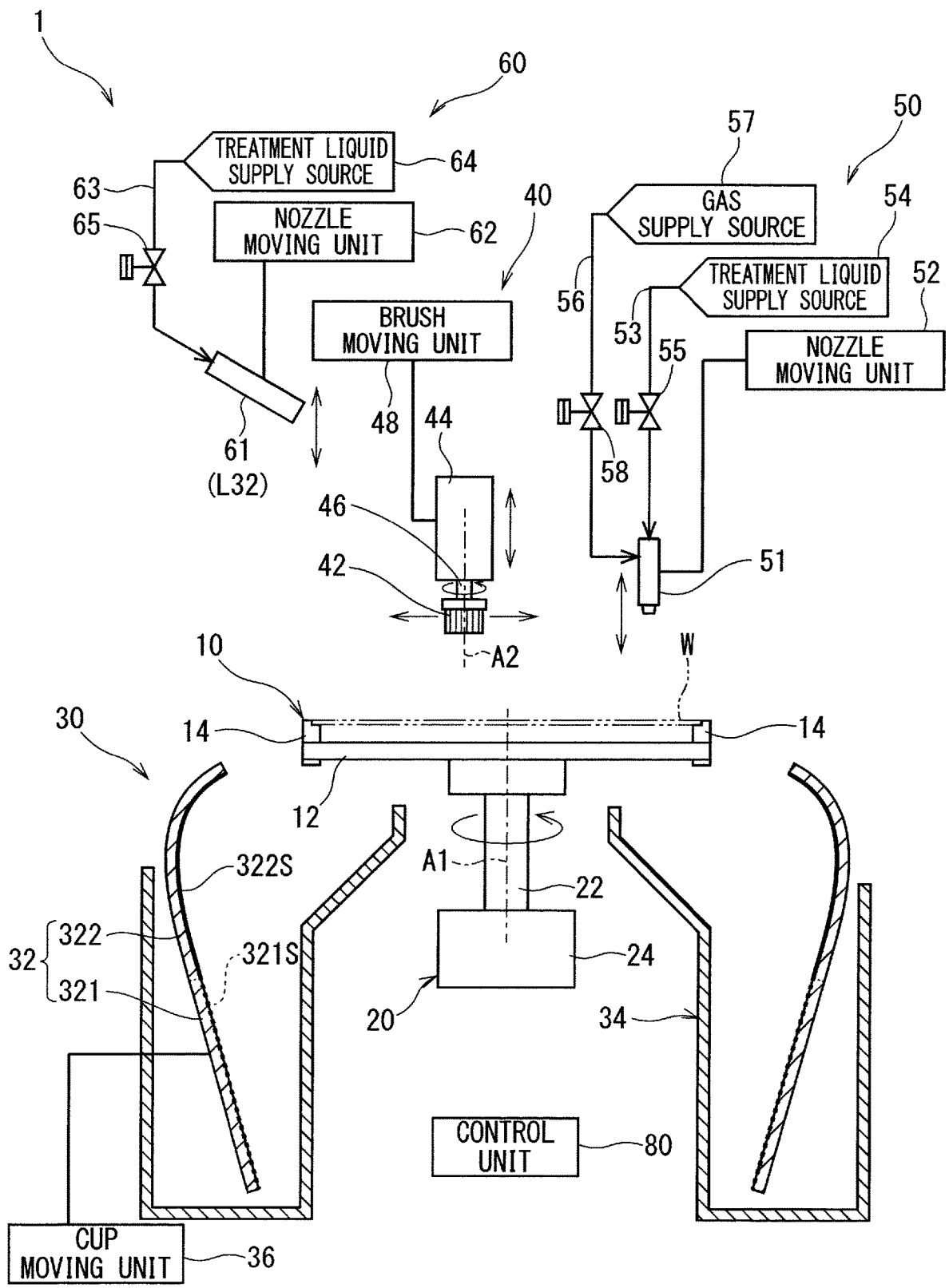
FIG. 1 is a schematic front view illustrating a substrate processing apparatus 1 according to a first embodiment.

Embodiments of the present invention will be described below with reference to the accompanying drawings. Components described in the embodiments are each only an example, so that the scope of the present invention does not intend to be limited to only the components. The dimensions of components and the number of components may be illustrated in exaggeration or in simplified form, as appropriate, in the drawings, for the sake of easier understanding.

1. First Embodiment

<Configuration of Substrate Processing Apparatus 1>

Figure 2:
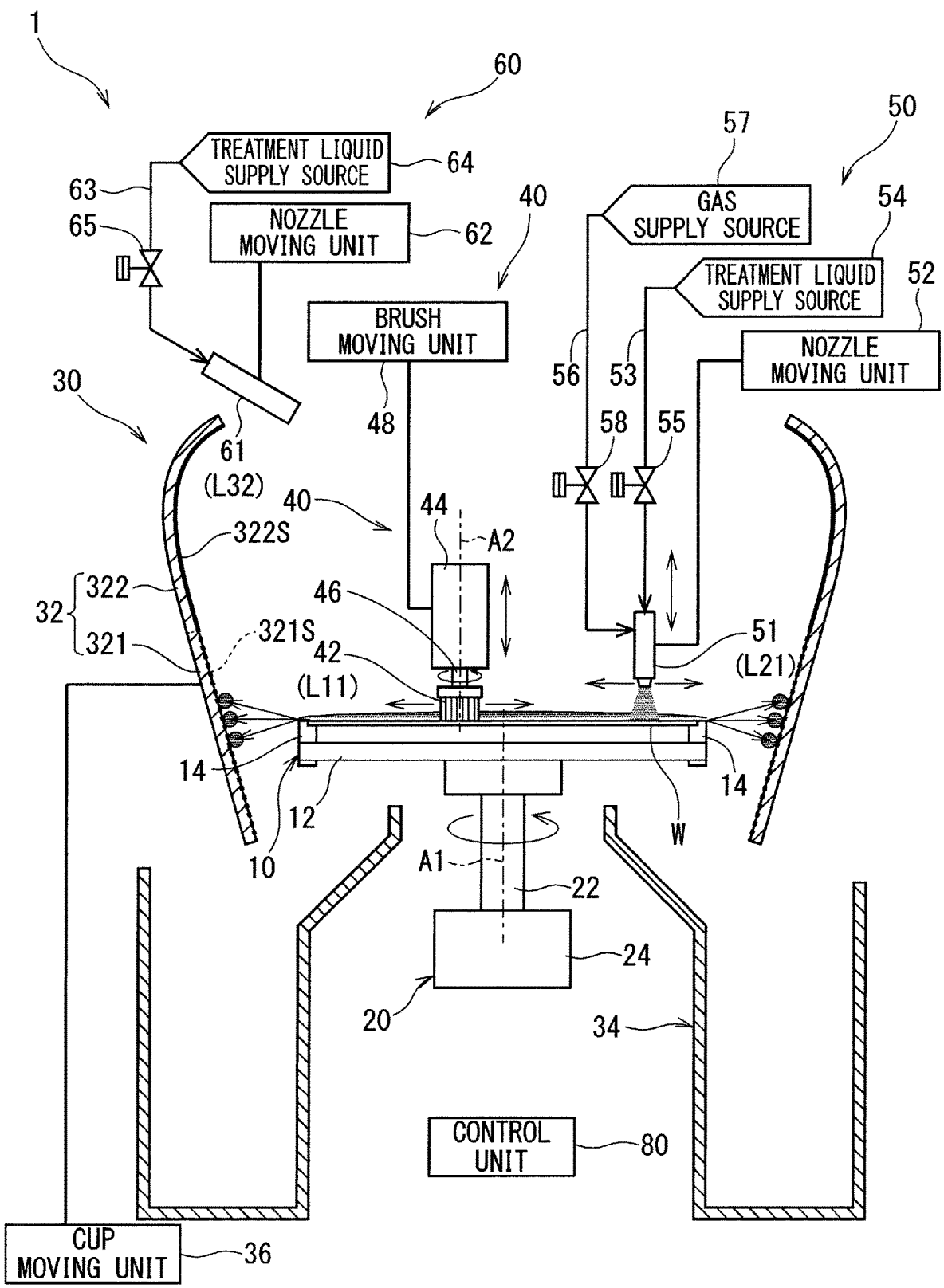
FIG. 2 is a schematic front view illustrating the substrate processing apparatus 1 according to the first embodiment.
Figure 3:
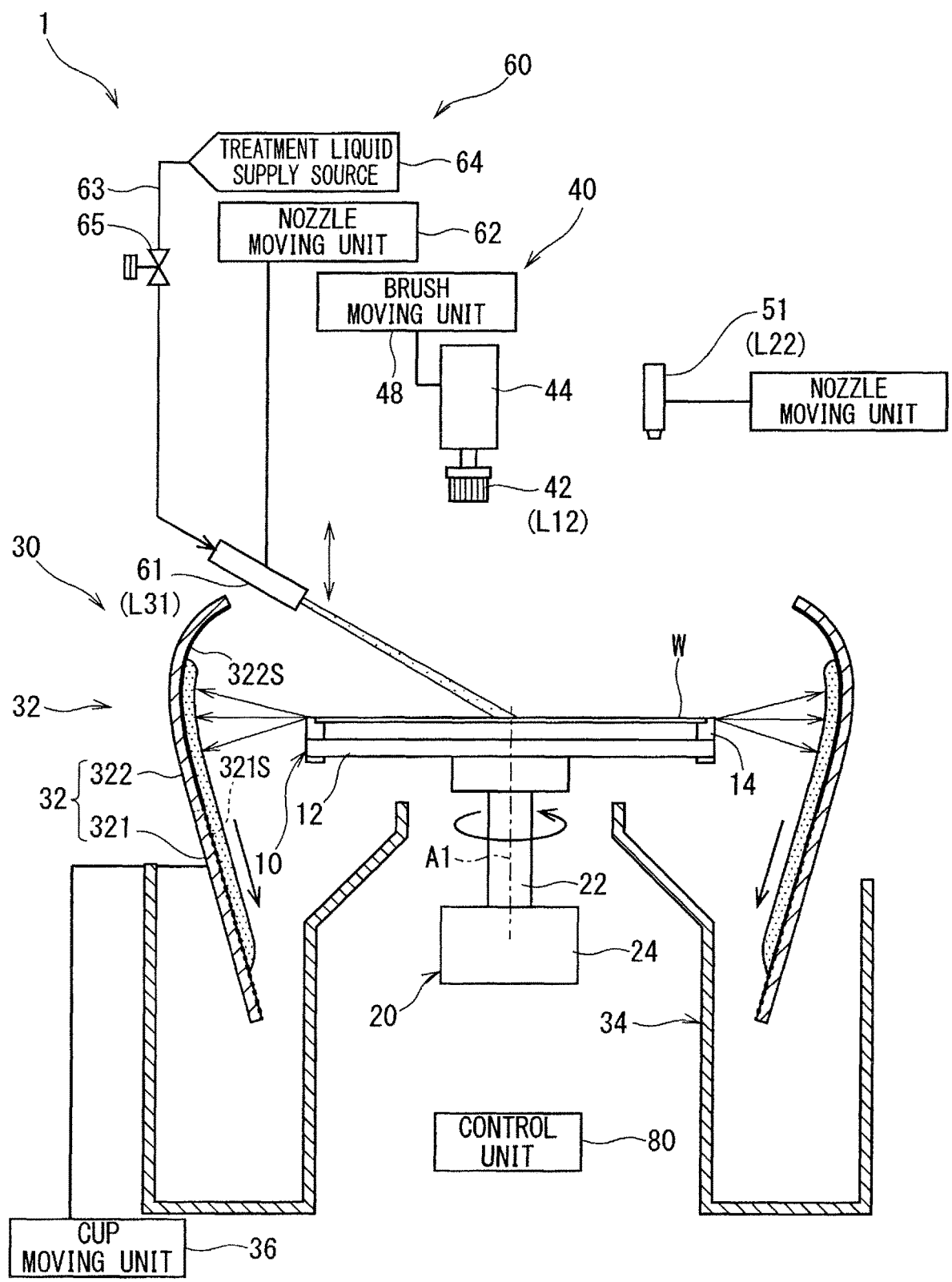
FIG. 3 is a schematic front view illustrating the substrate processing apparatus 1 according to the first embodiment.

FIGS. 1 to 3 each are a schematic front view illustrating a substrate processing apparatus 1 according to a first embodiment. In FIGS. 1 to 3, an upper cup part 32 and a lower cup part 34 of a cup part 30 are each illustrated as a cut surface taken along a vertical direction. FIG. 2 illustrates a state where a substrate W is surrounded by a first tubular portion 320 of the upper cup part 32, and FIG. 3 illustrates a state where the substrate W is surrounded by a second tubular portion 322 of the upper cup part 32.

The substrate processing apparatus 1 is configured as a so-called scrubber apparatus that brings a brush (a brush body 42) into contact with the substrate W rotating (here, a semiconductor wafer in a disk-like shape) to remove dust, attached substances, deposits, and the like on a surface of the substrate W. Specifically, the substrate processing apparatus 1 includes a substrate holder 10, a rotary drive unit 20, a cup part 30, a cleaning brush unit 40, a treatment liquid supplying unit 50, a treatment liquid supplying unit 60, and a control unit 80.

<Substrate Holder 10>

The substrate holder 10 includes a spin base part 12 and a plurality of chuck pins 14.

The spin base part 12 is formed in a disk shape having a radius slightly larger than that of the substrate W. The spin base part 12 is configured to be rotatable about a substrate rotation axis A1 along the vertical direction. The spin base part 12 has an upper surface that is a horizontal surface orthogonal to the substrate rotation axis A1.

The plurality of chuck pins 14 is disposed on the upper surface of the spin base part 12 at predetermined intervals around the substrate rotation axis A1. When each of the plurality of chuck pins 14 is pressed against a peripheral end surface of the substrate W, the substrate W is held in a horizontal posture. The horizontal posture refers to a state in which the main surfaces (surfaces with the largest area) on respective sides of the substrate W are parallel to the horizontal plane.

<Rotary Drive Unit 20>

The rotary drive unit 20 includes a rotation shaft 22 extending along the substrate rotation axis A1, and a spin motor 24 for rotating the rotation shaft 22 around the substrate rotation axis A1.

The spin base part 12 is attached to an upper end of the rotation shaft 22 in the vertical direction. When the rotation shaft 22 rotates around the substrate rotation axis A1, the substrate W held by the spin base part 12 and the plurality of chuck pins 14 integrally rotates around the substrate rotation axis A1.

<Cup Part 30>

The cup part 30 includes the upper cup part 32, the lower cup part 34, and a cup moving unit 36.

The upper cup part 32 is a member formed in a tubular shape (here, a cylindrical shape) with upper and lower portions that are open while surrounding the entire peripheral end of the substrate holder 10. The upper cup part 32 is configured to be vertically movable up and down along the substrate rotation axis A1 by the cup moving unit 36. The upper cup part 32 receives a treatment liquid shaken off outward from the substrate W rotating by surrounding the entire peripheral end of the substrate W held by the substrate holder 10. The upper cup part 32 is configured such that the liquid received on an inner peripheral surface of the upper cup part 32 can fall downward.

The lower cup part 34 is disposed below the upper cup part 32. The lower cup part 34 is configured to be able to receive the liquid received by the upper cup part 32 below and recover the liquid. The lower cup part 34 is appropriately provided at its bottom surface with a drainage mechanism for draining a liquid, such as a drainage pipe.

While material of the upper cup part 32 and the lower cup part 34 is not particularly limited, a resin (e.g., a fluorine-based synthetic resin such as Teflon (registered trademark)) can be used. When the upper cup part 32 is made of resin, weight reduction can be achieved.

The cup moving unit 36 may include an actuator such as an air cylinder, a pinion gear, a ball screw, or a linear motor.

The cup moving unit 36 moves up and down the upper cup part 32 along the substrate rotation axis A1 in response to a control signal of the control unit 80.

The upper cup part 32 has a first tubular portion 321 and a second tubular portion 322. The first tubular portion 321 and the second tubular portion 322 are each formed in a cylindrical shape that can surround the substrate W held by the substrate holder 10. The second tubular portion 322 is a portion directly connected to one side (upper side, here) of the first tubular portion 321 in the vertical direction. That is, a lower portion of the upper cup part 32 is the first tubular portion 321, and an upper portion of the upper cup part 32 is the second tubular portion 322.

The first tubular portion 321 has a smaller inner width (inner diameter) than the second tubular portion 322. Here, the upper cup part 32 decreases in inner width (inner diameter) from the second tubular portion 322 to the first tubular portion 321. Accordingly, the upper cup part 32 has an inner peripheral surface inclining inward from the second tubular portion 322 to the first tubular portion 321.

The first tubular portion 321 is formed in a tubular shape that gradually decreases in inner width vertically downward. It is not indispensable that the inner width decreased uniformly, and thus the first tubular portion 321 may have a portion that decreases in a stepwise manner.

The second tubular portion 322 is formed in a tubular shape that gradually decreases in inner width downward. Additionally, the second tubular portion 322 is provided in an upper portion with a portion that gradually decreases in inner width by extending inward. The second tubular portion 322 has the inner width that is more than a width (horizontal width) of the substrate W held by the spin base part 12 of the substrate holder 10, or the substrate holder 10, at any position in the vertical direction.

The first tubular portion 321 has an inner peripheral surface 321S being a hydrophilic surface that is more hydrophilic than an inner peripheral surface 322S of the second tubular portion 322. The inner peripheral surface 322S of the second tubular portion 322 is a hydrophobic surface that is more hydrophobic than the inner peripheral surface 321S. For example, when the upper cup part 32 is made of resin, sandblasting may be applied to the inner peripheral surface 321S of the first tubular portion 321 to form a hydrophilic surface.

When the inner peripheral surface 321S of the first tubular portion 321 is formed as a hydrophilic surface, a rebound of a liquid that is shaken off from the substrate W and collides with the inner peripheral surface 321S can be reduced. When the inner peripheral surface 322S of the second tubular portion 322 is formed as a hydrophobic surface, a liquid adhering to the inner peripheral surface 322S can favorably flow down along the inner peripheral surface 322S.

When the substrate W is loaded into the substrate processing apparatus 1 by a transfer apparatus (transfer robot) (not illustrated) or the like, the cup moving unit 36 moves down the upper cup part 32 such that the transfer apparatus places the substrate W on the plurality of chuck pins 14 as illustrated in FIG. 1. At this time, an upper end (an upper end of the second tubular portion 322) of the upper cup part 32 is preferably positioned below an upper surface of the substrate W when the substrate W is mounted on the plurality of chuck pins 14, and is more preferably positioned below the upper surface of the spin base part 12, for example.

As illustrated in FIG. 2, the cup moving unit 36 also moves and stops the upper cup part 32 so that the first tubular portion 321 of the upper cup part 32 is positioned to surround the entire peripheral end of the substrate W held by the substrate holder 10. At this time, a relative position of the upper cup part 32 with respect to the substrate holder 10 corresponds to a first relative position. As illustrated in FIG. 3, the cup moving unit 36 further moves and stops the upper cup part 32 so that the second tubular portion 322 of the upper cup part 32 is positioned to surround the entire peripheral end of the substrate W held by the substrate holder 10. At this time, a relative position of the upper cup part 32 with respect to the substrate holder 10 corresponds to a second relative position.

In the present embodiment, instead of moving the upper cup part 32 in the vertical direction using the cup moving unit 36, the substrate holder 10 may be moved in the vertical direction. However, the substrate holder 10 is connected to the rotary drive unit 20, so that a mechanism for moving the substrate holder 10 in the vertical direction may be complicated. Thus, moving the upper cup part 32 in the vertical direction can generally simplify an apparatus configuration as compared with moving the substrate holder 10.

<Cleaning Brush Unit 40>

The cleaning brush unit 40 includes a brush body 42, a rotation motor 44, a rotation shaft 46, and a brush moving unit 48.

The brush body 42 is formed in a substantially cylindrical columnar shape, and may be composed of a nylon brush, a sponge, or the like. The brush body 42 is disposed above the spin base part 12 of the substrate holder 10, and has a leading end that is brought into contact with the upper surface (a main surface facing upward) of the substrate W to clean the upper surface of the substrate W. The brush body 42 is connected at its upper end to one end of the rotation shaft 46 disposed parallel to the vertical direction.

The rotation motor 44 rotates the rotation shaft 46 around a brush rotation axis A2 along the vertical direction to rotate the brush body 42 around the brush rotation axis A2.

The brush moving unit 48 integrally moves the brush body 42, the rotation motor 44, and the rotation shaft 46 in the vertical direction and the horizontal direction. The brush moving unit 48 moves the brush body 42 between a contact position L11 (refer to FIG. 2) allowing the leading end of the brush body 42 to be brought into contact with the upper surface of the substrate W and a retreat position L12 (refer to FIG. 3) allowing the leading end of the brush body 42 to be separated from the upper surface of the substrate W. The movement of the brush body 42 between the contact position L11 and the retreat position L12 can be achieved by moving the brush body 42 in the vertical direction using the brush moving unit 48. Operation of the brush moving unit 48 is controlled by the control unit 80.

<Treatment Liquid Supplying Unit 50>

The treatment liquid supplying unit 50 includes a nozzle unit 51, a nozzle moving unit 52, treatment liquid piping 53, a treatment liquid supply source 54, a treatment liquid supply valve 55, gas piping 56, a gas supply source 57, and a gas supply valve 58.

The nozzle unit 51 is disposed above the spin base part 12 and is configured to be able to discharge a treatment liquid in a spray-like manner onto the upper surface of the substrate W held by the substrate holder 10. The nozzle unit 51 is moved by the nozzle moving unit 52 between a supply position L21 (refer to FIG. 2) at which the nozzle unit 51 has approached the upper surface of the substrate W to supply a treatment liquid and a retreat position L22 (refer to FIG. 3) above the supply position L21. The nozzle moving unit 52 also moves the nozzle unit 51 in the horizontal direction along the upper surface of the substrate W. Operation of the nozzle moving unit 52 is controlled by the control unit 80.

Here, the nozzle unit 51 is configured as a two-fluid nozzle. The nozzle unit 51 is configured to spray gas onto the treatment liquid to generate droplets of the treatment liquid, and discharge the droplets from the discharge port.

The nozzle unit 51 is connected to the treatment liquid piping 53. The treatment liquid piping 53 is connected to the treatment liquid supply source 54 to form a flow path for feeding the treatment liquid supplied from the treatment liquid supply source 54 to the nozzle unit 51. The treatment liquid supply source 54 can supply, as a treatment liquid, pure water (deionized water: DIW), SC1 (ammonia-hydrogen peroxide mixture: ammonia hydrogen peroxide solution), high purity citric acid aqueous solution, tetramethyl ammonium hydroxide (TMAH), NC2 (a mixture of TMY (trimethyl-2 hydroxyethyl ammonium hydroxide aqueous solution) and hydrogen peroxide solution), or the like. The treatment liquid supply valve 55 is interposed in the path of the treatment liquid piping 53.

The treatment liquid supply valve 55 supplies the treatment liquid to the nozzle unit 51 and stops the supply of the treatment liquid. When the treatment liquid supply valve 55 is opened to supply the treatment liquid to the nozzle unit 51 from the treatment liquid supply source 54, the treatment liquid is discharged from the discharge port at a leading end of the nozzle unit 51. The treatment liquid supply valve 55 may be configured to be able to adjust a flow rate of the treatment liquid to be supplied to the nozzle unit 51 by adjusting an opening degree of the treatment liquid piping 53. Operation of the treatment liquid supply valve 55 is controlled by the control unit 80.

The nozzle unit 51 is connected to the gas piping 56. The gas piping 56 is connected to the gas supply source 57 to form a flow path for feeding gas supplied from the gas supply source 57 to the nozzle unit 51. The gas supply source 57 can supply an inert gas ($N_2$, Ar, He, Kr, or Xe gas, or a mixed gas thereof) or air as the gas. The gas supply valve 58 is interposed in the path of the gas piping 56. The gas supply valve 58 supplies the gas to the nozzle unit 51 and stops the supply of the gas. When the gas supply valve 58 is opened to supply the gas to the nozzle unit 51, the treatment liquid and the gas are mixed in the nozzle unit 51. The gas supply valve 58 may also be configured to be able to adjust a flow rate of the gas to be supplied to the nozzle unit 51. Operation of the gas supply valve 58 is controlled by the control unit 80.

While the brush body 42 and the nozzle unit 51 are configured to move individually in the present embodiment, the nozzle unit 51 may be connected to the brush body 42 with a connecting member. In this case, the brush moving unit 48 moves the nozzle unit 51 together with the brush body 42. This enables the nozzle moving unit 52 to be eliminated.

<Treatment Liquid Supplying Unit 60>

The treatment liquid supplying unit 60 is configured to be able to supply a treatment liquid to the upper surface of the substrate W that rotates together with the substrate holder 10. The treatment liquid supplied by the treatment liquid supplying unit 60 may be the same as or different from the treatment liquid supplied by the treatment liquid supplying unit 50.

The treatment liquid supplying unit 60 includes a nozzle unit 61, a nozzle moving unit 62, treatment liquid piping 63, a treatment liquid supply source 64, and a treatment liquid supply valve 65.

The nozzle unit 61 is disposed above the spin base part 12 to be able to discharge a treatment liquid onto the substrate W held by the substrate holder 10. Here, the nozzle unit 61 discharges the treatment liquid obliquely to the vertical direction toward a central portion of the upper surface of the substrate W (a position of the substrate rotation axis A1). A supply position of the treatment liquid on the substrate W by the nozzle unit 61 is not limited to the central portion, and thus it may be set appropriately. A discharge direction of the treatment liquid from the nozzle unit 61 may also be set appropriately.

The nozzle unit 61 is moved by the nozzle moving unit 62 between a supply position L31 (refer to FIG. 3) at which the nozzle unit 61 has approached the substrate W to supply a treatment liquid and a retreat position L32 (refer to FIG. 2) above the supply position L31. Operation of the nozzle moving unit 62 is controlled by the control unit 80.

The nozzle unit 61 is connected to the treatment liquid piping 63. The treatment liquid piping 63 is connected to the treatment liquid supply source 64 to form a flow path for feeding the treatment liquid supplied from the treatment liquid supply source 64 to the nozzle unit 61. The treatment liquid supply source 64 can supply, as a treatment liquid, pure water (deionized water: DIW), SC1 (ammonia-hydrogen peroxide mixture: ammonia hydrogen peroxide solution), high purity citric acid aqueous solution, tetramethyl ammonium hydroxide (TMAH), NC2 (a mixture of TMY (trimethyl-2 hydroxyethyl ammonium hydroxide aqueous solution), hydrogen peroxide solution), or the like. The treatment liquid supply valve 65 is interposed in the path of the treatment liquid piping 63.

The treatment liquid supply valve 65 supplies the treatment liquid to the nozzle unit 61 and stops the supply of the treatment liquid. When the treatment liquid supply valve 65 is opened to supply the treatment liquid to the nozzle unit 61 from the treatment liquid supply source 64, the treatment liquid is discharged from the discharge port at a leading end of the nozzle unit 61. The treatment liquid supply valve 65 may be configured to be able to adjust a flow rate of the treatment liquid to be supplied to the nozzle unit 61 by adjusting an opening degree of the treatment liquid piping 63. Operation of the treatment liquid supply valve 65 is controlled by the control unit 80.

Each of the cleaning brush unit 40, the treatment liquid supplying unit 50, and the treatment liquid supplying unit 60 is an example of a processing unit.

<Control Unit 80>

The control unit 80 may be similar in hardware configuration to a typical computer. Specifically, the control unit 80 includes a CPU that performs various computation processes, a ROM or read-only memory for storing a basic program therein, a RAM or readable/writable memory for storing various kinds of information therein, and an auxiliary storage unit (recording medium) for storing control software, or data or the like, therein. Each of elements such as the CPU, the ROM, the RAM, and the auxiliary storage unit of the control unit 80 is connected by a bus.

The control unit 80 controls operation of each of the spin motor 24, the cup moving unit 36, the rotation motor 44, the brush moving unit 48, the nozzle moving unit 52, the treatment liquid supply valve 55, the gas supply valve 58, the nozzle moving unit 62, and the treatment liquid supply valve 65. The control unit 80 executes control of these elements according to a preset recipe (processing program). The recipe describes conditions of processing to be applied to an object in a predetermined data format. Specifically, processing procedures or processing contents (e.g., the number of rotations, the processing time, and the amount of supply) are described. Such a recipe is appropriately stored in the auxiliary storage unit.

<Operation of Substrate Processing Apparatus 1>

Next, operation of the substrate treatment apparatus 1 will be described. The operation of the substrate processing apparatus 1 described below is an example, and the present invention is not limited to this. Each operation of the substrate processing apparatus 1 is performed under control of the control unit 80 unless otherwise specified.

Figure 4:
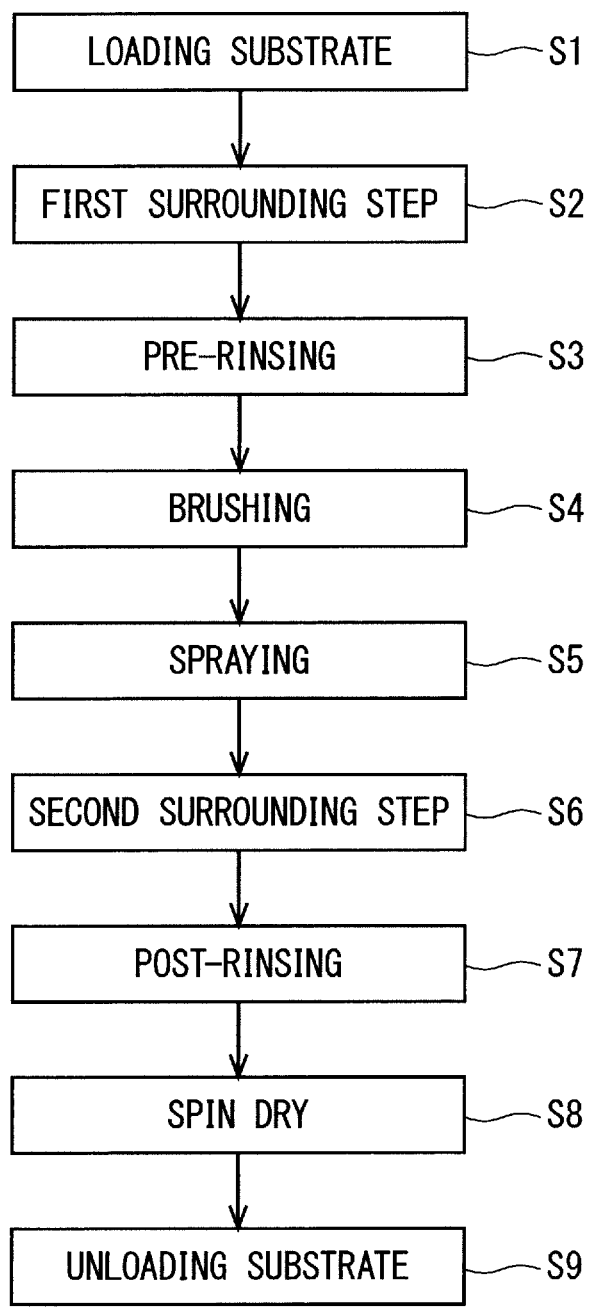
FIG. 4 is a flowchart illustrating an example of an operation flow of the substrate processing apparatus 1 of the first embodiment.

FIG. 4 is a flowchart illustrating an example of an operation flow of the substrate processing apparatus 1 of the first embodiment. First, the substrate processing apparatus 1 performs a substrate loading step S1. Specifically, as illustrated in FIG. 1, in a state where the upper cup part 32 is disposed below the spin base part 12 of the substrate holder 10, an untreated substrate W is placed on the plurality of chuck pins 14 of the substrate holder 10 by the transfer apparatus (not illustrated). When the plurality of chuck pins 14 holds the entire peripheral end of the substrate W, the substrate W is held by the substrate holder 10 in a horizontal posture. This step of holding the substrate W in the horizontal posture by the substrate holder 10 corresponds to a substrate holding step.

Subsequently, the substrate processing apparatus 1 performs a first surrounding step S2. Specifically, the cup moving unit 36 moves and stops the upper cup part 32 so that the first tubular portion 321 of the upper cup part 32 is positioned to surround the substrate W held by the substrate holder 10 (refer to FIG. 2). This causes the substrate W to be surrounded by the first tubular portion 321.

Subsequently, the substrate processing apparatus 1 performs a pre-rinsing step S3. In the pre-rinsing step S3, the spin motor 24 rotates the spin base part 12 at a predetermined rotation speed (e.g., 1000 rpm) to rotate the substrate W. Then, the nozzle unit 61 supplies a treatment liquid (such as pure water) to the substrate W. When a predetermined time elapses, the nozzle unit 61 stops discharging the treatment liquid.

Subsequently, the substrate processing apparatus 1 performs a brushing step S4. Specifically, the spin motor 24 rotates the spin base part 12 at a predetermined rotation speed (e.g., 300 rpm) to rotate the substrate W. Then, the brush moving unit 48 moves down the brush body 42 from the retreat position L12 to the contact position L11 to bring brush body 42 into contact with the upper surface of the substrate W, and the rotation motor 44 rotates the brush body 42 around the brush rotation axis A2. The brush moving unit 48 also moves the brush body 42 in a horizontal direction along the upper surface of the substrate W, so that the brush body 42 physically cleans the entire upper surface of the substrate W (refer to FIG. 2).

In the brushing step S4, the nozzle unit 61 (or the nozzle unit 51) or the like may supply a treatment liquid (e.g., pure water). At this time, the substrate W is rotated at a relatively low rotational speed (e.g., 300 rpm), so that the entire upper surface of the substrate W may be covered with a paddle-like liquid film (film of the treatment liquid). In the brushing step S4, a chemical solution such as SC1, as the treatment liquid, may be supplied to the upper surface of the substrate W.

The substrate processing apparatus 1 may be configured to skip the brushing step S4 to perform the next processing (spraying step S5).

Subsequently, the substrate processing apparatus 1 performs the spraying step S5. Specifically, the spin motor 24 rotates the spin base part 12 at a predetermined rotation speed (e.g., 500 rpm to 1000 rpm) to rotate the substrate W.

Then, the nozzle moving unit 52 moves the nozzle unit 51 to the supply position L21, and the nozzle unit 51 discharges the treatment liquid in a spray-like manner toward the substrate W. The nozzle moving unit 52 also moves the nozzle unit 51 in the horizontal direction along the upper surface of the substrate W. This allows the treatment liquid in a spray-like manner to be supplied to the entire upper surface of the substrate W. The treatment liquid on the substrate W is shaken off outward of the substrate W by rotation of the substrate W, and is received by the first tubular portion 321 of the upper cup part 32. The liquid received by the first tubular portion 321 may include foreign matter (particles) that is an unnecessary substance generated by the brushing.

Subsequently, the substrate processing apparatus 1 performs a second surrounding step S6. Specifically, the cup moving unit 36 moves and stops the upper cup part 32 so that the second tubular portion 322 of the upper cup part 32 is positioned to surround the substrate W held by the substrate holder 10 (refer to FIG. 3). This causes the substrate W to be surrounded by the second tubular portion 322.

Subsequently, the substrate processing apparatus 1 performs a post-rinsing step S7. Specifically, the spin motor 24 rotates the spin base part 12 at a predetermined rotation speed (e.g., 1000 rpm) to rotate the substrate W. Then, the nozzle unit 61 supplies pure water to the upper surface of the substrate W as a rinse liquid. The treatment liquid supplied to the upper surface of the substrate W rotating is shaken off outward of the substrate W and received by the second tubular portion 322 (refer to FIG. 3).

Subsequently, the substrate processing apparatus 1 performs a spin dry step S8. Specifically, the spin motor 24 rotates the spin base part 12 at a predetermined rotation speed (e.g., 2400 rpm to 3000 rpm) to rotate the substrate W at high speed. Then, the rinse liquid remaining on the upper surface of the substrate W is shaken off outward of the substrate W and received by the second tubular portion 322. This allows the upper surface of the substrate W to be dried. The rinse liquid received by the second tubular portion 322 can flow down along an inner peripheral surface of the first tubular portion 321 of the upper cup part 32. This enables foreign material adhering to the first tubular portion 321 to be removed.

The liquid received by the first tubular portion 321 in the brushing step S4 and the spraying step S5 (first treatment), and the liquid received by the second tubular portion 322 in the post-rinsing step S7 and the spin dry step S8 (second treatment) are each discharged to the outside of the apparatus through the same drainage mechanism (such as a drainage pipe) provided in the lower cup part 34.

Subsequently, the substrate processing apparatus 1 performs a substrate unloading step S9. Specifically, the cup moving unit 36 moves down the upper cup part 32 to dispose the upper cup part 32 below the spin base part 12 of the substrate holder 10. Then, holding of the substrate W using the plurality of chuck pins 14 of the substrate holder 10 is released. The substrate W released from holding is unloaded to the outside by the transfer apparatus (not illustrated).

When the substrate W is unloaded, the substrate processing apparatus 1 moves each element of the substrate processing apparatus 1 to an initial position to perform preparation of receiving loading of a next untreated substrate W. After that, the substrate processing apparatus 1 performs the substrate loading step S1 again.

As described above, the substrate processing apparatus 1 enables the substrate W to be surrounded by the first tubular portion 321 or the second tubular portion 322, being different in position in the vertical direction of the upper cup part 32, by changing a relative position of the upper cup part 32 with respect to the substrate W using the cup moving unit 36. This enables the substrate W to be subjected to the brushing step S4 and the spraying step S5 (first treatment) while being surrounded by the first tubular portion 321, and the substrate W to be subjected to the post-rinsing step S7 and the spin dry step S8 (second treatment) while being surrounded by the second tubular portion of the cup part. As a result, even when foreign matter exists in the liquid shaken off from the substrate W during the brushing step S4 and the spraying step S5, the foreign matter may adhere to the first tubular portion 321. During the post-rinsing step S7 and the spin dry step S8, the substrate W is surrounded by the second tubular portion 322, so that reattachment of the foreign matter adhering to the first tubular portion 321 to the substrate W can be effectively reduced.

The second tubular portion 322 is connected to an upper side of the first tubular portion 321. Thus, even when foreign matter adheres to the first tubular portion 321 during the brushing step S4 and the spraying step S5 (first treatment), the first tubular portion 321 is disposed below the upper surface of the substrate W during the post-rinsing step S7 and the spin dry step S8 (second treatment). This enables reattachment of the foreign matter adhering to the first tubular portion 321 to the substrate W to be effectively reduced during the post-rinsing step S7 and the spin dry step S8.

In particular, when rotation speed of the substrate W during the post-rinsing step S7 and the spin dry step S8 (second treatment) is increased more than that of the substrate W during the brushing step S4 and the spraying step S5 (first treatment), a liquid on the substrate W can collide with the second tubular portion 322 at high speed. However, adhesion of foreign matter, which may be generated during the brushing step S4 and the spraying step S5, to the second tubular portion 322 is suppressed, so that adhesion of the foreign matter to the substrate W can be effectively reduced.

In addition, the second tubular portion 322 is connected to the upper side of the first tubular portion 321, so that a liquid (here, a rinse liquid) shaken off from the upper surface of the substrate W during the post-rinsing step S7 and the spin dry step S8 (second treatment) can flow down along the inner peripheral surface of the first tubular portion 321 after colliding with the second tubular portion 322 (refer to FIG. 3). In particular, the upper cup part 32 gradually decreases in inner width from the second tubular portion 322 to the first tubular portion in the present example, so that the liquid shaken off from the substrate W flows down along an inclined surface formed by the inner peripheral surfaces 322S and 321S of the second tubular portion 322 and the first tubular portion 321. As a result, foreign matter adhering to the inner peripheral surface of the first tubular portion 321 during the brushing step S4 and the spraying step S5 (first treatment) can be washed away with the rinse liquid shaken off from the substrate W during the post-rinsing step S7 and the spin dry step S8. In particular, a large amount of rinse liquid is supplied to the substrate W during the post-rinsing step S7, so that foreign matter on the inner peripheral surface 321S of the first tubular portion 321 can be washed away. Thus, fixing of the foreign matter to the first tubular portion 321 of the upper cup part 32 can be effectively reduced.

As described above, washing away the inner peripheral surface 321S of the first tubular portion 321 with the rinse liquid enables a subsequent unprocessed substrate W to be surrounded by the relatively clean first tubular portion 321 when the unprocessed substrate W is subjected to the brushing step S4 and the spraying step S5. Thus, adhesion of foreign matter generated during treatment of a previous substrate W to a subsequent substrate W during treatment can be effectively reduced.

In addition, a liquid shaken off from the substrate W during the brushing step S4 and the spraying step S5 is received by the inner peripheral surface 321S of the first tubular portion 321. The inner peripheral surface 321S is a hydrophilic surface (a surface having a higher hydrophilicity than the inner peripheral surface 322S of the second tubular portion 322). This enables reduction in rebound of a liquid containing foreign matter on the inner peripheral surface 322S of the second tubular portion 322 during the brushing step S4 and the spraying step S5, so that reattachment of the foreign matter to the substrate W can be reduced.

In addition, a liquid (rinse liquid) shaken off from the substrate W during the post-rinsing step S7 and the spin dry step S8 is received by the inner peripheral surface 322S of the second tubular portion 322, being a hydrophobic surface. Thus, a liquid adhering to the second tubular portion 322 is likely to flow down along the inner peripheral surface 322S during the post-rinsing step S7 and the spin dry step S8. The inner peripheral surface 321S of the first tubular portion 321 can be suitably cleaned by the liquid flowing down from the inner peripheral surface 322S.

2. Second Embodiment

Next, a second embodiment will be described. In the following description, an element having the same function as that already described will be denoted by the same reference sign or a reference sign added with an alphabet letter, and detailed description may be eliminated.

Figure 5:
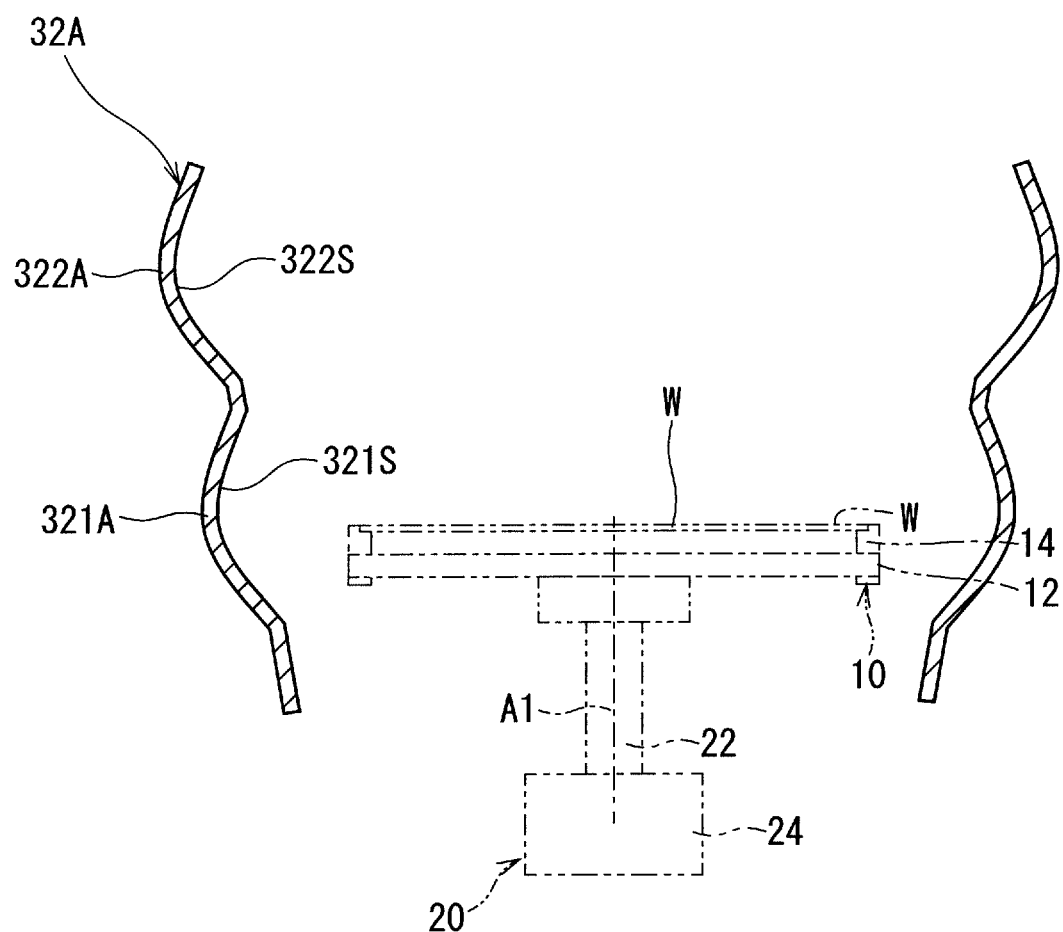
FIG. 5 is a schematic side view illustrating an upper cup part 32A of a second embodiment.

FIG. 5 is a schematic side view illustrating an upper cup part 32A of the second embodiment. In FIG. 5, the upper cup part 32A is illustrated as a cut surface taken along a vertical direction. As with the upper cup part 32, the upper cup part 32A includes a first tubular portion 321A disposed on a lower side, and a second tubular portion 322A connected to an upper side of the first tubular portion 321A. The upper cup part 32A has a connecting portion between the upper tubular portion 321A and the second tubular portion 322A, having a constricted shape, and the first tubular portion 321A and the second tubular portion 322A are each provided at its vertically intermediate portion with an inner peripheral surface extending outward.

When the upper cup part 32A having a shape as described above is moved in the vertical direction by a cup moving unit 36, a substrate W can be surrounded by the first tubular portion 321A or the second tubular portion 322A, as illustrated in FIG. 5.

The upper cup part 32A is configured such that disposing the substrate W at or near the vertically intermediate portion of the first tubular portion 321A or the second tubular portion 322A enables a liquid shake off upward to be received by an inner peripheral surface 321S or 322S of the first tubular portion 321A or the second tubular portion 322A.

For example, when the brushing step S4 and the spraying step S5 are performed while the substrate W is surrounded by the first tubular portion 321A, a probability that a liquid containing foreign matter adheres to the second tubular portion 322A is reduced. When the substrate W is surrounded by the vertically intermediate portion or its vicinity of the second tubular portion 322A, a probability that a liquid shaken off from the substrate W scatters outward from the upper cup part 32 is reduced.

3. Third Embodiment

Figure 6:
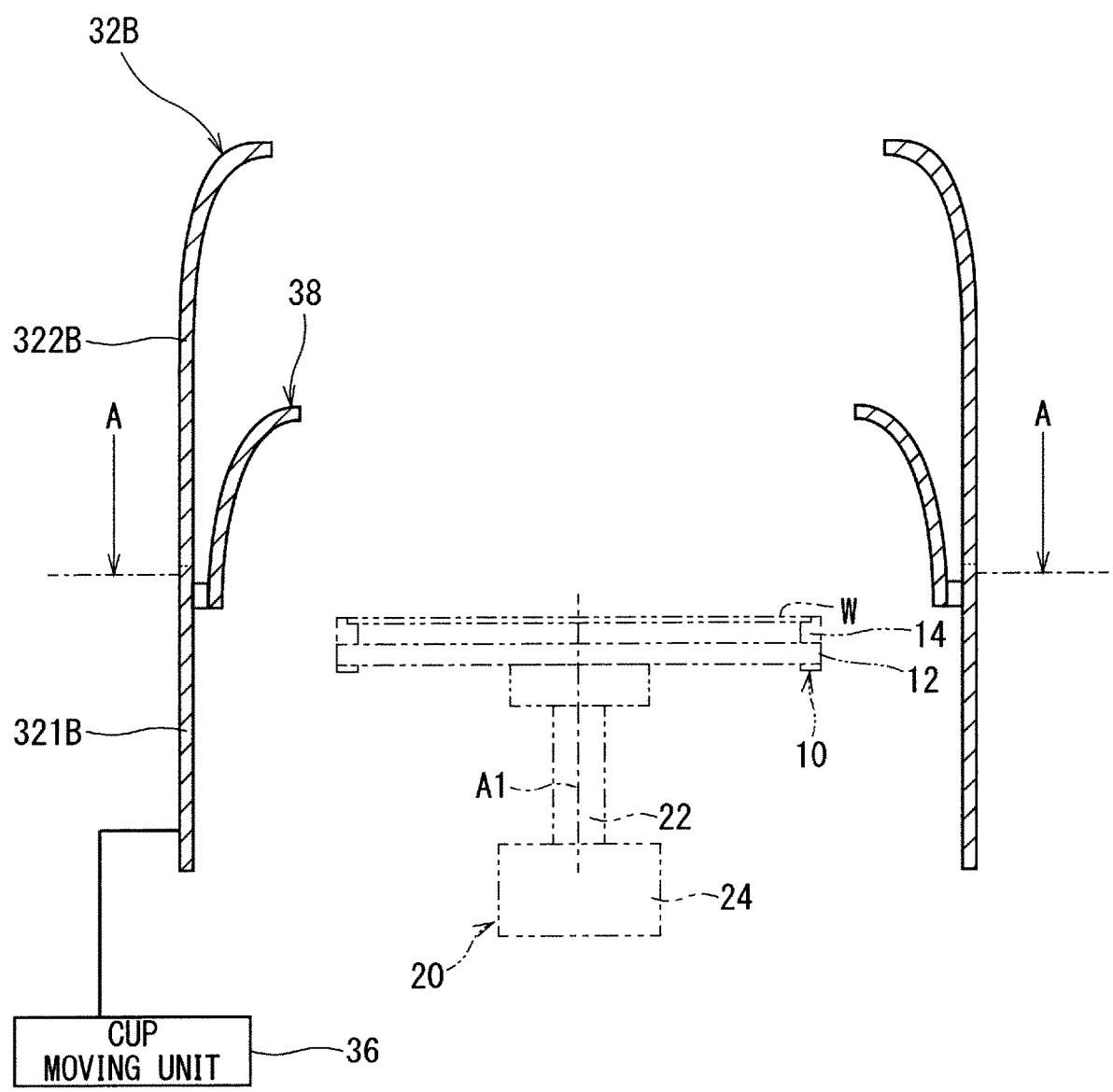
FIG. 6 is a schematic side view illustrating an upper cup part 32B of a third embodiment.
Figure 7:
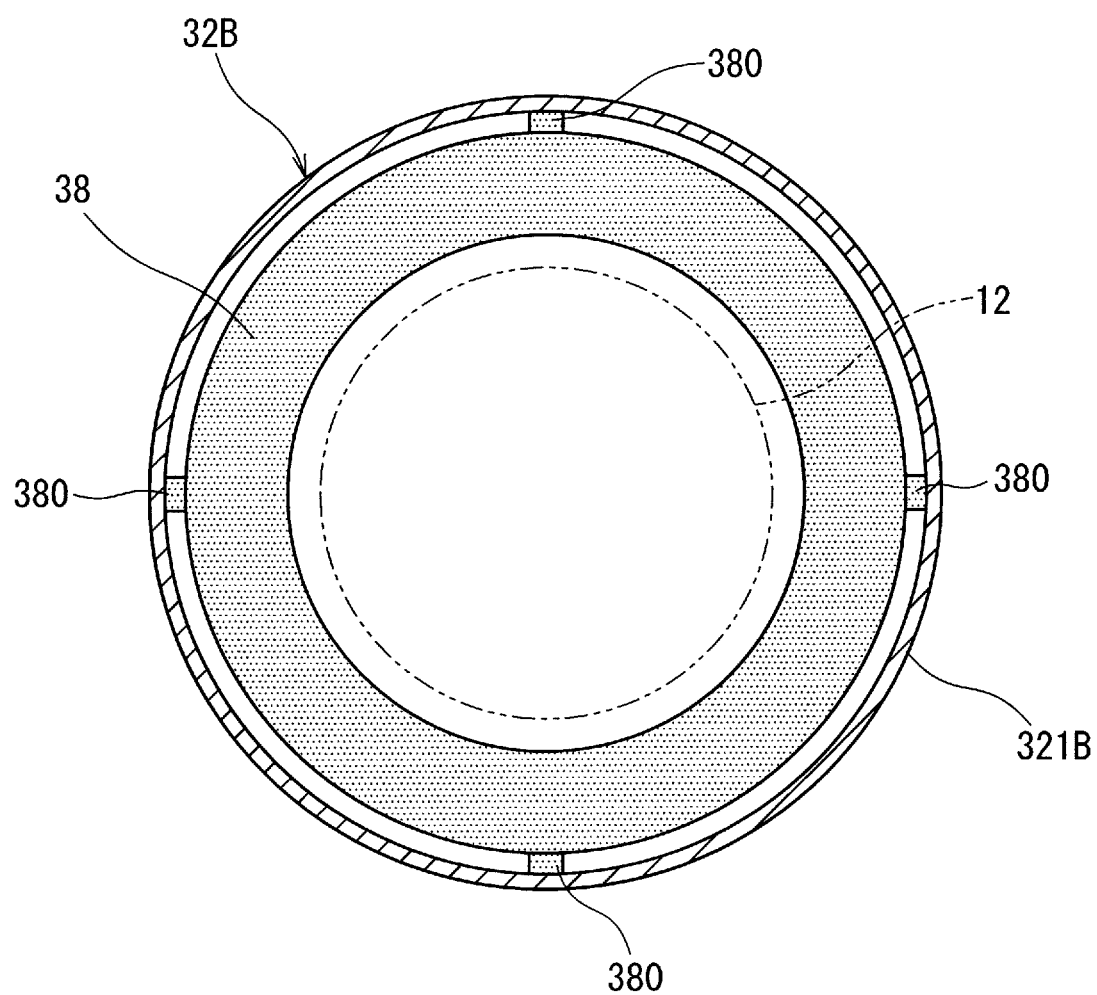
FIG. 7 is a schematic plan view illustrating a cut surface of the upper cup part 32B taken along position A-A illustrated in FIG. 6.

FIG. 6 is a schematic side view illustrating an upper cup part 32B of a third embodiment. FIG. 7 is a schematic plan view illustrating a cut surface of the upper cup part 32B taken along position A-A illustrated in FIG. 6. In FIG. 6, the upper cup part 32B is illustrated as a cut surface taken along a vertical direction. In FIG. 7, only the upper cup part 32B is illustrated in a sectional view, and an annular part 38 is illustrated in a plan view.

As with the upper cup part 32, the upper cup part 32B includes a first tubular portion 321B disposed on a lower side, and a second tubular portion 322B directly connected to an upper side of the first tubular portion 321B. The second tubular portion 322B has an upper portion decreasing upward in inner width. The first tubular portion 321B has an inner width that is substantially equal to an inner width of a lower portion of the second tubular portion 322B.

The upper cup part 32B includes the annular part 38. The annular part 38 is provided in a vertically intermediate portion of the upper cup part 32B, and is connected at its outer edge portion to the first tubular portion 321B with a plurality of connecting parts 380 (here, four) interposed therebetween. This forms a gap between an inner peripheral surface 321S of the first tubular portion 321B and the outer edge portion of the annular part 38.

The annular part 38 is also formed in a shape projecting inward of the upper cup part 32B. Here, the annular part 38 projects upward in the vertical direction and inward of the upper cup part 32B. The annular part 38 has an inner edge portion constituting a circular hole through which a spin base part 12 and a substrate W held on the spin base part 12 can vertically pass.

When the substrate W is treated while being surrounded by the first tubular portion 321B provided with the annular part 38, a liquid flowing toward the second tubular portion 322B above the first tubular portion 321B, included in liquids shaken off from the substrate W, can be received by the annular part 38. This effectively enables to reduce adhering to the second tubular portion 322B of the foreign matter contained in the liquid.

When the substrate W is treated while being surrounded by the second tubular portion 322B, the liquid shaken off from the substrate W and received by the second tubular portion 322B passes through the gap between the first tubular portion 321B and the annular part 38 to enable foreign matter adhering to the first tubular portion 321B to be washed away.

The annular part 38 is also applicable to each of the upper cup part 32 (refer to FIG. 1) of the first embodiment and the upper cup part 32A (refer to FIG. 5) of the second embodiment.

4. Fourth Embodiment

Figure 8:
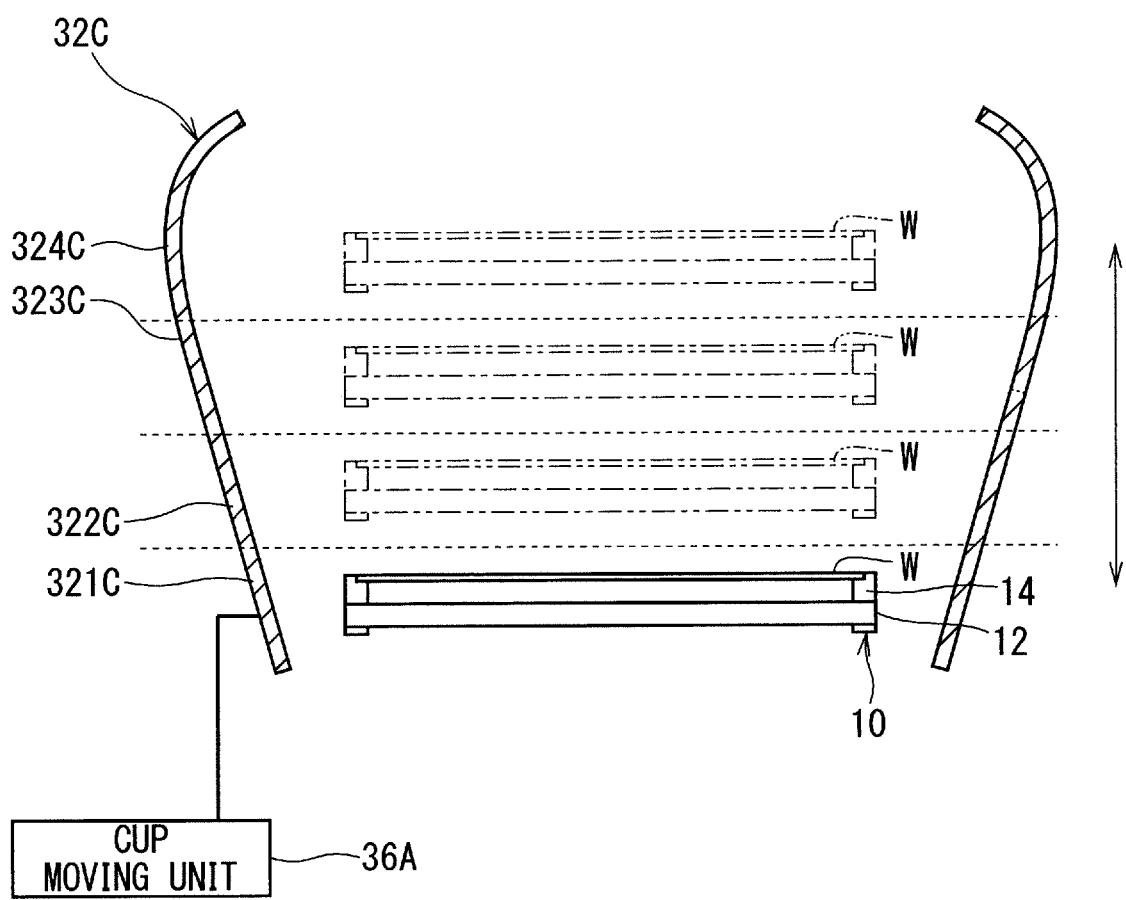
FIG. 8 is a schematic side view illustrating an upper cup part 32C and a cup moving unit 36A of a fourth embodiment.

FIG. 8 is a schematic side view illustrating an upper cup part 32C and a cup moving unit 36A of a fourth embodiment. In FIG. 8, the upper cup part 32C is illustrated as a cut surface taken along a vertical direction. It is added that each position of a substrate W and a substrate holder 10 illustrated in FIG. 8 is a relative position when viewed from the upper cup part 32C, and is not acquired by vertical movement of the substrate W and the substrate holder 10.

The upper cup part 32C has a shape substantially identical to that of the upper cup part 32. The upper cup part 32C includes four cylindrical portions (a first tubular portion 321C, a second tubular portion 322C, a third tubular portion 323C, and a fourth tubular portion 324C) from a lower side to an upper side in the vertical direction. That is, the second tubular portion 322C is directly connected to an upper side of the first tubular portion 321C, the third tubular portion 323C is directly connected to an upper side of the second tubular portion 322C, and the fourth tubular portion 324C is directly connected to an upper side of the third tubular portion 323C.

The cup moving unit 36A vertically moves the upper cup part 32C to move and stop the upper cup part 32C to and at a position allowing the substrate W to be surrounded by the corresponding one of the four cylindrical portions (the first tubular portion 321C to the fourth tubular portion 324C). This enables the upper cup part 32C to receive a liquid shaken off from the substrate W while the substrate W is surrounded by the corresponding one of the four cylindrical portions different in shape.

Applying sandblasting or the like to an inner peripheral surface of each of the first tubular portion 321C to the fourth tubular portion 324C enables the inner peripheral surface thereof to have properties of hydrophilicity or hydrophobicity. The properties of hydrophilicity or hydrophobicity that can be imparted to each of the inner peripheral surfaces of the first tubular portion 321C to the fourth tubular portion 324C can be appropriately selected according to treatment contents of the substrate W.

When the upper cup part 32C and the cup moving unit 36A are employed, each treatment of the substrate W described in FIG. 4 can be performed while the substrate W is surrounded by any of the first tubular portion 321C to the fourth tubular portion 324C. Specifically, the pre-rinsing step S3 and the brushing step S4 can be performed while the substrate W is surrounded by the first tubular portion 321C, and the spraying step S5 can be performed while the substrate W is surrounded by the second tubular portion 322C. In addition, the post-rinsing step S7 can be performed while the substrate W is surrounded by the third tubular portion 323C, and the spin dry step S8 can be performed while the substrate W is surrounded by the fourth tubular portion 324C. When the pre-rinsing step S3 uses the same treatment liquid (rinse liquid) as the post-rinsing step S7, the pre-rinsing step S3 can be performed while the substrate W is surrounded by the third tubular portion 323C as in the post-rinsing step S7.

As described above, using the upper cup part 32C and the cup moving unit 36A enables a liquid shaken off from the substrate W to be received in many portions of the upper cup part 32C. When the tubular portion for surrounding the substrate W for treatment that is likely to generate foreign matter is different from that for another treatment, adhesion of foreign matter to the substrate W can be effectively reduced.

5. Modification

While the embodiments are described above, the present invention is not limited to the above-described embodiments, and various modifications are available.

For example, while the substrate processing apparatus 1 of each of the above embodiments is configured to perform scrubber treatment, the present invention is also effective for a substrate processing apparatus that performs another treatment (e.g., resist coating treatment, development treatment).

Each of the above embodiments also describes a glass substrate for a liquid crystal display as an object to be treated by the substrate processing apparatus. However, examples of the substrate to be treated may include a semiconductor wafer, a glass substrate for a photomask, a glass substrate for a plasma display, a glass or ceramic substrate for a magnetic and optical disk, a glass substrate for an organic EL, a glass substrate or a silicon substrate for a solar cell, and other various substrates to be treated for an electronic apparatus, such as a flexible substrate and a printed substrate.

While the present invention is described in detail, the description above is an example in all aspects, and the invention is not limited to the description. Thus, it is perceived that countless variations being not shown by way of example can be assumed without departing from the scope of the present invention. Each configuration described in the above-described embodiments and the modifications can be appropriately combined or eliminated as long as no contradiction arises.

EXPLANATION OF REFERENCE SIGNS

1: substrate processing apparatus
10: substrate holder
20: rotary drive unit
24: spin motor
30: cup part
32, 32A, 32B, 32C: upper cup part
321, 321A, 321B, 321C: first tubular portion
321S: inner peripheral surface
322, 322A, 322B, 322C: second tubular portion
322S: inner peripheral surface
323C: third tubular portion
324C: fourth tubular portion
36, 36A: cup moving unit (relative movement mechanism)
38: annular part
380: connecting part
40: cleaning brush unit
42: brush body
44: rotation motor
48: brush moving unit
50: treatment liquid supplying unit
60: treatment liquid supplying unit
80: control unit
A1: substrate rotation axis
W: substrate

The invention claimed is:

1. A substrate processing apparatus for treating a substrate, the substrate processing apparatus comprising:
a substrate holder that holds a substrate in a horizontal posture, and rotates around a rotation axis parallel to a vertical direction;
a rotary drive unit that rotates the substrate holder;
a processing unit that supplies a treatment liquid to the substrate held by the substrate holder to treat the substrate;
a cup part having a first tubular portion and a second tubular portion, being formed each in a tubular shape capable of surrounding the substrate held by the substrate holder, the first tubular portion being connected on one side in the vertical direction to the second tubular portion, the first tubular portion receiving the treatment liquid shaken off from the substrate in a first treatment, the second tubular portion receiving the treatment liquid shaken off from the substrate in a second treatment, the second tubular portion being connected to an upper side of the first tubular portion; and
a relative movement mechanism that moves the cup part and the substrate holder relative to each other in the vertical direction, stops the relative movement at a first relative position where the first tubular portion surrounds the substrate held by the substrate holder in the first treatment, and stops the relative movement at a second relative position where the second tubular portion surrounds the substrate held by the substrate holder in the second treatment, wherein
the cup part has an inner peripheral surface including a first inner peripheral surface of the first tubular portion and a second inner peripheral surface of the second tubular portion, and the inner peripheral surface of the cup part has a shape in which the treatment liquid received by the second inner peripheral surface flows down along the second inner peripheral surface and the first inner peripheral surface in this order in the second treatment, wherein the first tubular portion has a portion with an inner width smaller than that of the second tubular portion,
further comprising:
an annular part that is provided in a vertically intermediate portion of the cup part while projecting inward of the cup part from the first inner peripheral surface of the first tubular portion, and that has an inner edge portion provided with a hole allowing the substrate holder to pass through the hole in the vertical direction; and
a connecting part connecting the first tubular portion and the annular part while forming a gap between the first tubular portion and the annular part.

2. The substrate processing apparatus according to claim 1, wherein an inner width of the cup part gradually decreases from the second tubular portion to the first tubular portion.

3. The substrate processing apparatus according to claim 1, wherein the first inner peripheral surface of the first tubular portion is a hydrophilic surface having more hydrophilicity than the second inner peripheral surface of the second tubular portion.

4. The substrate processing apparatus according to claim 1, wherein the rotary drive unit rotates the substrate holder at a higher speed when the cup part is positioned at the second relative position than when the cup part is positioned at the first relative position.

5. The substrate processing apparatus according to claim 1, wherein
the cup part further includes a third tubular portion that is connected to one side of the second tubular portion in the vertical direction while being formed to be able to surround the substrate, and
the relative movement mechanism relatively moves the cup part in the vertical direction with respect to the substrate holder to stop the cup part at a third relative position where the third tubular portion surrounds the substrate held by the substrate holder.

6. The substrate processing apparatus according to claim 1, further comprising: a lower cup part that is disposed below the cup part and is configured to recover the treatment liquid in the first treatment and the second treatment liquid with a same drainage pipe.

7. The substrate processing apparatus according to claim 1, wherein the relative movement mechanism relatively moves the cup part in the vertical direction with respect to the substrate holder.

8. A substrate processing apparatus for treating a substrate, the substrate processing apparatus comprising:
- a substrate holder that holds a substrate in a horizontal posture, and rotates around a rotation axis parallel to a vertical direction;
- a rotary drive unit that rotates the substrate holder;
- a cup part having a first tubular portion and a second tubular portion, being formed each in a tubular shape capable of surrounding the substrate held by the substrate holder, the first tubular portion being connected on one side in the vertical direction to the second tubular portion;
- a processing unit that supplies a treatment liquid to the substrate held by the substrate holder to treat the substrate; and
- a relative movement mechanism that moves the cup part and the substrate holder relative to each other in the vertical direction to stop the relative movement at each of a first relative position where the first tubular portion surrounds the substrate held by the substrate holder and a second relative position where the second tubular portion surrounds the substrate held by the substrate holder;
- wherein the rotary drive unit rotates the substrate holder at a higher speed when the cup part is positioned at the second relative position than when the cup part is positioned at the first relative position; and wherein the processing unit includes the relative movement mechanism, the rotary drive unit, and a control unit that controls the processing unit, and
- the control unit performs the first treatment of supplying the treatment liquid to the substrate rotating while causing the cup part to stop at the first relative position, and the second treatment of removing the liquid on a surface of the substrate by rotating the substrate while causing the cup part to stop at the second relative position.

9. The substrate processing apparatus according to claim 8, wherein the first treatment includes a process of forming a film of the treatment liquid throughout an upper surface of the substrate.

10. The substrate processing apparatus according to claim 8, wherein
- the processing unit further includes a brush unit that is brought into contact with the surface of the substrate and a brush moving mechanism that moves the brush unit between a contact position allowing the brush unit to be brought into contact with the substrate and a retreat position separated from the substrate, and
- the control unit also controls the brush moving mechanism, the first treatment including brushing of treating the substrate while bringing the brush unit into contact with the substrate rotating.

* * * * *